United States Patent [19]

Ernst et al.

[11] 4,305,036

[45] Dec. 8, 1981

[54] METHOD AND APPARATUS FOR HIGH RESOLUTION NUCLEAR MAGNETIC RESONANCE SPECTROSCOPY

[75] Inventors: Ludger Ernst; David N. Lincoln; Viktor Wray, all of Wolfenbuettel, Fed. Rep. of Germany

[73] Assignee: Gesellschaft für Biotechnologische Forschung mbH, Braunschweig-Stöckheim, Fed. Rep. of Germany

[21] Appl. No.: 55,820

[22] Filed: Jul. 9, 1979

[51] Int. Cl.³ ............................................. G01N 27/00
[52] U.S. Cl. ..................................................... 324/321
[58] Field of Search ......................................... 324/321

[56] References Cited

U.S. PATENT DOCUMENTS 2,960,649 11/1960 Bloch ................................. 324/321
3,091,732 5/1963 Anderson et al. ................. 324/321
3,681,683 8/1972 Huber ................................. 324/321
3,746,971 7/1973 Storey ................................ 324/321
3,911,355 10/1975 Leane ................................. 324/321
4,077,002 2/1978 Erwine ............................... 324/321
4,088,944 5/1978 Engler ................................ 324/321

Primary Examiner—Michael J. Tokar
Attorney, Agent, or Firm—Brumbaugh, Graves, Donohue & Raymond

[57] ABSTRACT

A nuclear magnetic resonance line broadened by an inhomogeneous magnetic field can be narrowed by rotating the sample. This, however, produces rotational side bands having a frequency equal to the frequency of a main signal plus/minus integer multiples of the speed of rotation. The generation of such spurious rotational side bands is avoided by varying the speed of rotation of the sample within a predetermined range of speeds. The lower limit of said range should be high enough to provide for narrowing the nuclear magnetic resonance lines by rotating the sample.

12 Claims, 5 Drawing Figures

METHOD AND APPARATUS FOR HIGH RESOLUTION NUCLEAR MAGNETIC RESONANCE SPECTROSCOPY

The present invention relates to high resolution nuclear magnetic resonance (NMR) spectroscopy, specifically to suppressing rotational side bands in a high resolution NMR spectrum.

The measurement of the nuclear magnetic resonance (NMR) of a sample includes essentially the steps of subjecting the sample both to a magnetic field, which should be as homogeneous as possible, and a high frequency (r.f.) field and measuring the r.f. absorption of the sample as a function of either the field strength of the magnetic field or the frequency of the r.f. field. Microsecond r.f. pulses may be applied to the sample in the magnetic field instead of the variable "monochromatic" high frequency, the effect of such pulses being equivalent to a simultaneous application of a large multitude of discrete frequencies. The pulse-interferogram (an intensity-time function) obtained in this way, is transformed by Fourier transformation to the more usual intensity-frequency function. The NMR-techniques briefly mentioned above are disclosed more specifically e.g. in the book by K. Müllen and P. S. Pregosin "Fourier Transform NMR Techniques: A Practical Approach", Academic Press, London, New York, San Francisco, 1976, specifically in chapters 1.3 and 1.4.

It is known that a NMR line is broadened by an inhomogeneous magnetic field, and that such a broadening can be reduced by sample spinning, as described e.g. in the book by J. W. Emsley et al "High Resolution Nuclear Magnetic Resonance Spectroscopy", Pergamon Press, Oxford, Vol. 1, 1965, 206, 207. Two types of spinning have been proposed: Firstly, to spin the sample at a speed greater than 20 cycles sec$^{-1}$ with constant speed, and secondly a more or less random rotation, i.e. turning the sample for a specific turning angle during a relatively short period of time alternating with periods of varying time duration, during which the sample is at rest. The aim of these spinning methods is to reduce the broadening of a NMR line by an inhomogeneous magnetic field, and spinning the sample with constant speed is generally in use. The second type of rotation, namely the random rotation has proved too complicated and expensive for practical purposes.

Spinning the sample with constant speed produces rotational side bands, i.e. small signals which appear at frequencies which are equal to the frequency of the main signal plus/minus integer multiples of the spinning or rotation speed. Such spurious side bands may seriously impair the clearness of the NMR spectrum.

According to the invention, the undesirable rotational side bands in the high resolution NMR spectrum obtained from a spinning sample in a not ideally homogeneous magnetic field are avoided or at least substantially reduced by varying the rotational speed of the spinning sample within a predetermined range above a predetermined minimum speed during the measurement.

Preferably, the speed is varied more than once between a lower and an upper speed limit during the measurement.

The speed variation may be effected in steps or continuously, e.g. in accordance with a sine function.

A high resolution nuclear magnetic resonance spectrometer according to the invention comprises means for spinning the sample during the measurement and means for varying the speed of rotation of the sample.

The NMR spectrometer preferably comprises an air turbine for spinning the sample, said air turbine being provided with means for varying the supply of pressurized air to said turbine.

Spurious rotational side bands can be essentially avoided by the proposed variation of the speed of the spinning sample. The speed change can be effected by simple means, and existing NMR spectrometers can be easily modified to enable the proposed variation of the spinning speed.

In case of stepwise changes of the spinning speed, the results will be the better the smaller the steps chosen.

The minimum speed should be chosen such that the known rotational narrowing of the NMR lines is effected by spinning the sample. A convenient and preferred minimum speed is in the range of about 10 to 20 cycles per second. The maximum speed should be chosen such that no objectional turbulences are generated in a sample solution. Thus, the speed should generally not exceed 50 to 100 cycles per second.

The speed range chosen may be run through once or several times.

Figure 1:
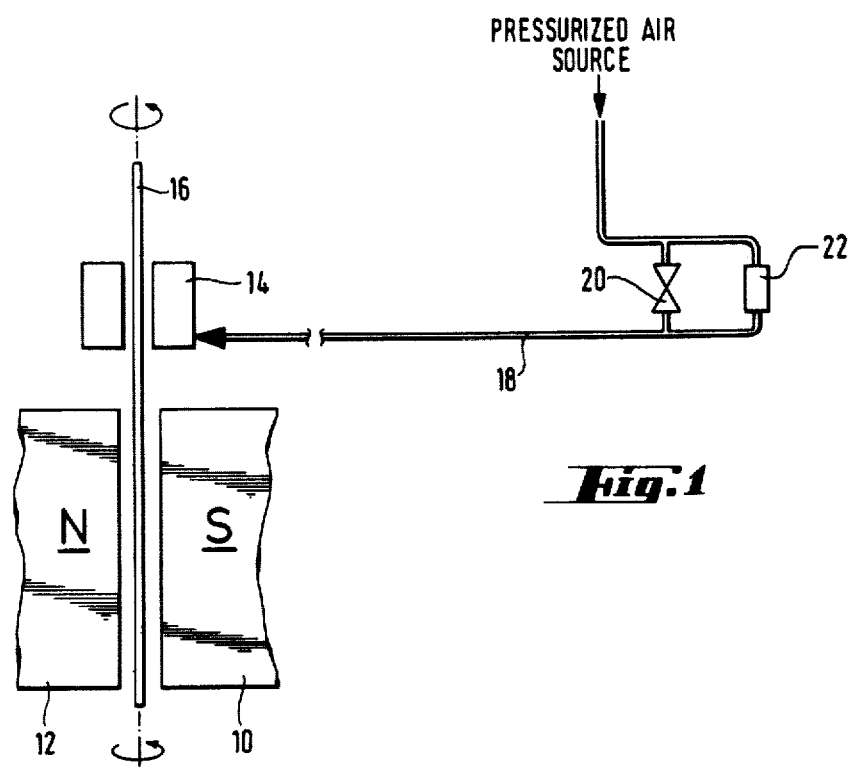
FIG. 1 is a simplified view of the parts of a NMR spectrometer essential to the present invention.

With reference to FIG. 1, only a pair of pole pieces 10,12 of a magnet, and a pressurized air turbine 14 for spinning a sample holder (not shown) of a NMR spectrometer are depicted which may be constructed as known and may be a commercially available instrument. Further, a sample tube 16 is shown which is positioned in the sample holder, and is rotatable by the air turbine 14 during measurement. The pressurized air turbine 14 is connected by a pressurized air line 18 to a pressurized air source (not shown) which may e.g. comprise a compressor or a pressurized air bottle and provides pressurized air of relatively constant pressure, as usual in the art.

Figure 2:
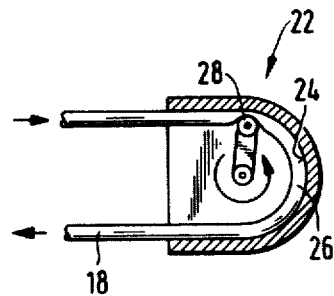
FIG. 2 is a sectional view of a modified peristaltic pump which may be used in the spectrometer of FIG. 1, and FIGS. 3a, b, and c are two NMR spectra obtained with different sample spinning speeds by a known method of measurement, and a NMR spectrum of the same sample obtained with a proposed variation of the spinning speed according to the invention, respectively.

Serially connected into the pressurized air line 18 is a parallel connection of a valve 20 and a device 22 which is similar to a peristaltic pump and shown in more detail in FIG. 2.

The device 22 is connected to a drive system, e.g. an electric motor, not shown, which drives the device 22 with a speed which is very much lower than the speed of the turbine 14, and may be e.g. 20 cycles per minute. The device 22 acts as variable flow resistance connected in parallel to valve 20, which serves to establish the lower speed limit of the turbine 14. Thus, the device 22 in combination with the valve 20 enables one to vary the speed of the turbine between a lower limit established by the valve 20 and an upper limit which is attained when the peristaltic pump is "open".

In the case of very long measurements, which may last for several hours, the turbine speed may be varied in steps by hand. Generally, the speed variation is effected between a lower speed limit, which generally should not be less than 10 cycles per second, and an upper limit which is established by the construction of the apparatus and the conditions of the experiment, e.g. the kind and viscosity of the sample.

The device 22 is similar to a known peristaltic pump modified to serve as variable flow resistance. A peristaltic pump comprises a housing having an inner wall 24 abutted by a flexible portion of the line 18, e.g. a length of plastic tubing 26. In the present case, the tubing is squeezed by a single roller 28 supported by one end of an arm, the other end being affixed to a shaft rotated by the electric motor. One single roller 28 is used instead of several rollers in a normal peristaltic pump, because the device 22 is intended to act as a variable flow resistance rather than a pump. The inner wall 24 may have the shape of a cylinder concentric to the shaft of the device or alternatively may have the shape of a spiral or another non-circular cross section.

When the device 22 blocks the flow of the air from the pressurized air source to the turbine 14, the speed of the turbine is determined by the amount of the air passed by the valve 20. When the roller 28 is disengaged from the tubing 26, the device 22 provides an additional amount of pressurized air and the rotational speed is then determined by the combined air flow through valve 20 and device 22.

Figure 3:
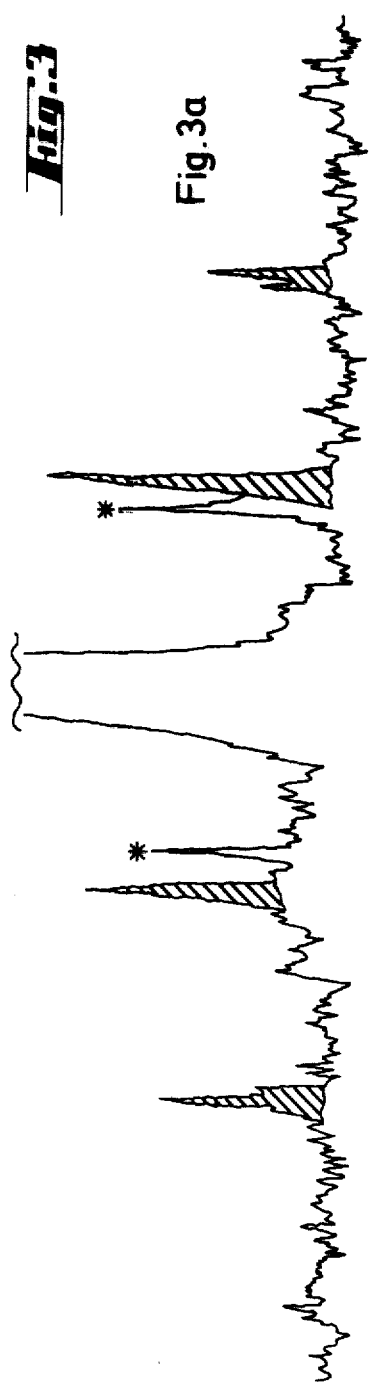
Figure 3:
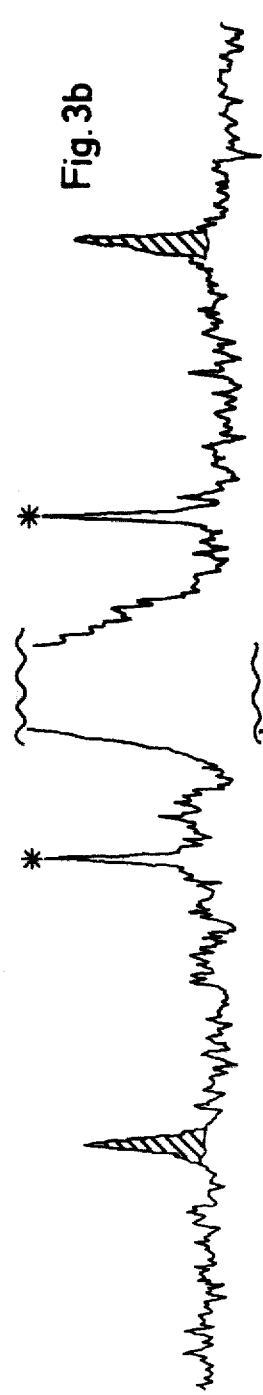
Figure 3:
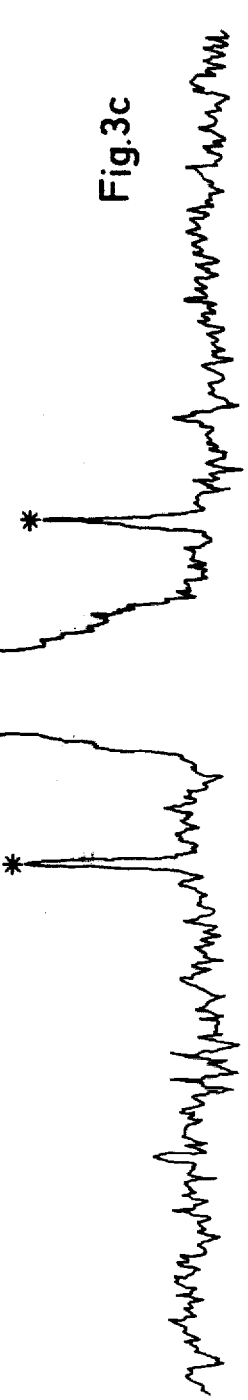

FIG. 3 shows three $^{13}$C {$^1$H} NMR spectra of the methyl-carbon-atom of ethanol (natural isotopic abundance), each accumulated during several hours of measurement. The spectra were obtained under identical conditions, with the exception of the speed of rotation, with a commercial NMR spectrometer (Varian type CFT 20).

The spectrum shown in FIG. 3a was made with an rotational speed of the sample of 23 cycles per second and the spectrum according to FIG. 3b was made with a rotational speed of 50 cycles per second. The undesired rotational side bands are shown by hatching.

When the spectrum shown in FIG. 3c was obtained, the rotational speed of the spinning sample was continuously varied from 30 to 60 cycles per second with a period of 30 seconds. The undesired rotational side bands have disappeared while the desired signals and $^{13}$C satellites (marked by an asterisk) and the remaining spectrum are essentially unchanged.

The variation of the spinning speed of the sample can be effected in various ways. Thus, the speed may be varied once or several times monotonously between two limits, of which the lower one, as stated, should not be too low. Alternatively, the variation can be effected in steps.

Any desired device which enables control of the air supply to the turbine driving the sample holder may be used to vary the sample speed.

While in practical NMR spectrometers the sample rotation is generally effected by pressurized air, other driving systems are also conceivable, e.g. by a rotating electromagnetic field as in an induction motor. In such case the exciting frequency and/or voltage may be used for varying the sample speed.

Other modifications will occur to those skilled in the art.

We claim:

1. A method of suppressing rotational side bands in a spectrum of high resolution nuclear magnetic resonance, wherein a rotating sample is subjected to a not entirely homogeneous magnetic field, and a high frequency field, and the nuclear magnetic resonance of the sample is determined as a function of the frequency of the high frequency field or the field strength of the magnetic field, characterized in that the rotational speed of the rotating sample is varied continuously in a range which is above a predetermined minimum speed while the nuclear magnetic resonance spectrum of the sample is being determined.

2. The method as claimed in claim 1 wherein said minimum speed is 10 cycles per second.

3. The method as claimed in claim 1 wherein said minimum speed is 20 cycles per second.

4. The method as claimed in claim 1, 2 or 3, wherein the speed is varied more than once between a lower and an upper limit.

5. A method as claimed in any of claims 1 2 or 3 wherein said variation is effected in a continuous manner.

6. A method as claimed in claim 5 wherein said variation is effected in accordance with a sine function.

7. A nuclear magnetic resonance spectrometer comprising
    means for supporting a sample at a predetermined location;
    means for producing a magnetic field at said location, said magnetic field being essentially, but not completely homogeneous;
    means for producing a high frequency field at said location;
    means for varying at least one of said fields for exciting nuclear magmetic resonances;
    means for sensing the high frequency absorption of said sample;
    means for spinning said sample with a speed of rotation;
    the improvement consisting in
    means for varying said speed of rotation of said sample within a range of speeds while the high frequency absorption of said sample is being sensed.

8. The NMR spectrometer as claimed in claim 7 wherein said means for spinning said sample comprises a pressurized air turbine and said means for varying said speed comprises means for varying the supply of pressurized air to said turbine.

9. The NMR spectrometer as claimed in claim 8, wherein said means for varying the supply of pressurized air comprises a parallel connection of a valve and a variable flow resistance, said parallel connection being connected in series in a pressurized air supply line.

10. The NMR spectrometer as claimed in claim 9, wherein said variable flow resistance comprises a flexible tube and means for squeezing said tube.

11. The NMR spectrometer of claim 7, 8 or 9 wherein said means for varying said speed of rotation comprises driving means for automatically and periodically varying said speed of rotation.

12. A method of suppressing rotational side bands in a spectrum of high resolution nuclear magnetic resonance, wherein a rotating sample is subjected to a not entirely homogeneous magnetic field, and a high frequency field, and the nuclear magnetic resonance of the sample is determined as a function of the frequency of the high frequency field or the field strength of the magnetic field, characterized in that the rotational speed of the rotating sample is varied in steps in a range which is above a predetermined minimum speed while the nuclear magnetic resonance spectrum of the sample is being determined.

* * * * *